United States Patent [19]

Jenkins

[11] 4,181,975
[45] Jan. 1, 1980

[54] DIGITAL DELAY LINE APPARATUS

[75] Inventor: James R. Jenkins, Fort Worth, Tex.

[73] Assignee: Rockwell International Corporation, El Segundo, Calif.

[21] Appl. No.: 923,262

[22] Filed: Jul. 10, 1978

[51] Int. Cl.² ............................ H03K 5/00; G06F 3/00
[52] U.S. Cl. ..................................... 364/900; 307/232; 328/155
[58] Field of Search ................. 364/900; 307/208, 232, 307/262, 293; 328/129, 155, 133

[56] References Cited

U.S. PATENT DOCUMENTS

| | | | |
|---|---|---|---|
| 3,723,714 | 3/1973 | Jackson et al. ...................... | 307/232 |
| 3,870,970 | 3/1975 | Chibana .............................. | 328/155 |
| 3,991,322 | 11/1976 | Bush et al. .......................... | 307/293 |
| 4,019,153 | 4/1977 | Cox, Jr. et al. ...................... | 328/155 |
| 4,025,775 | 5/1977 | Beauvais et al. ..................... | 307/232 |
| 4,153,896 | 5/1979 | White ................................. | 340/146.3 AH |

Primary Examiner—Leo H. Boudreau
Attorney, Agent, or Firm—Bruce C. Lutz; Howard R. Greenberg; H. Fredrick Hamann

[57] ABSTRACT

Apparatus is illustrated for delaying in increments of infinitesimally small electrical angles the data bits in a data stream using an addressable elastic buffer which is addressed by a phase lock loop used to compare the output data with a reference. The comparison can be as a result of a frame detection pulse or any other suitable characteristic of the data being delayed.

5 Claims, 1 Drawing Figure

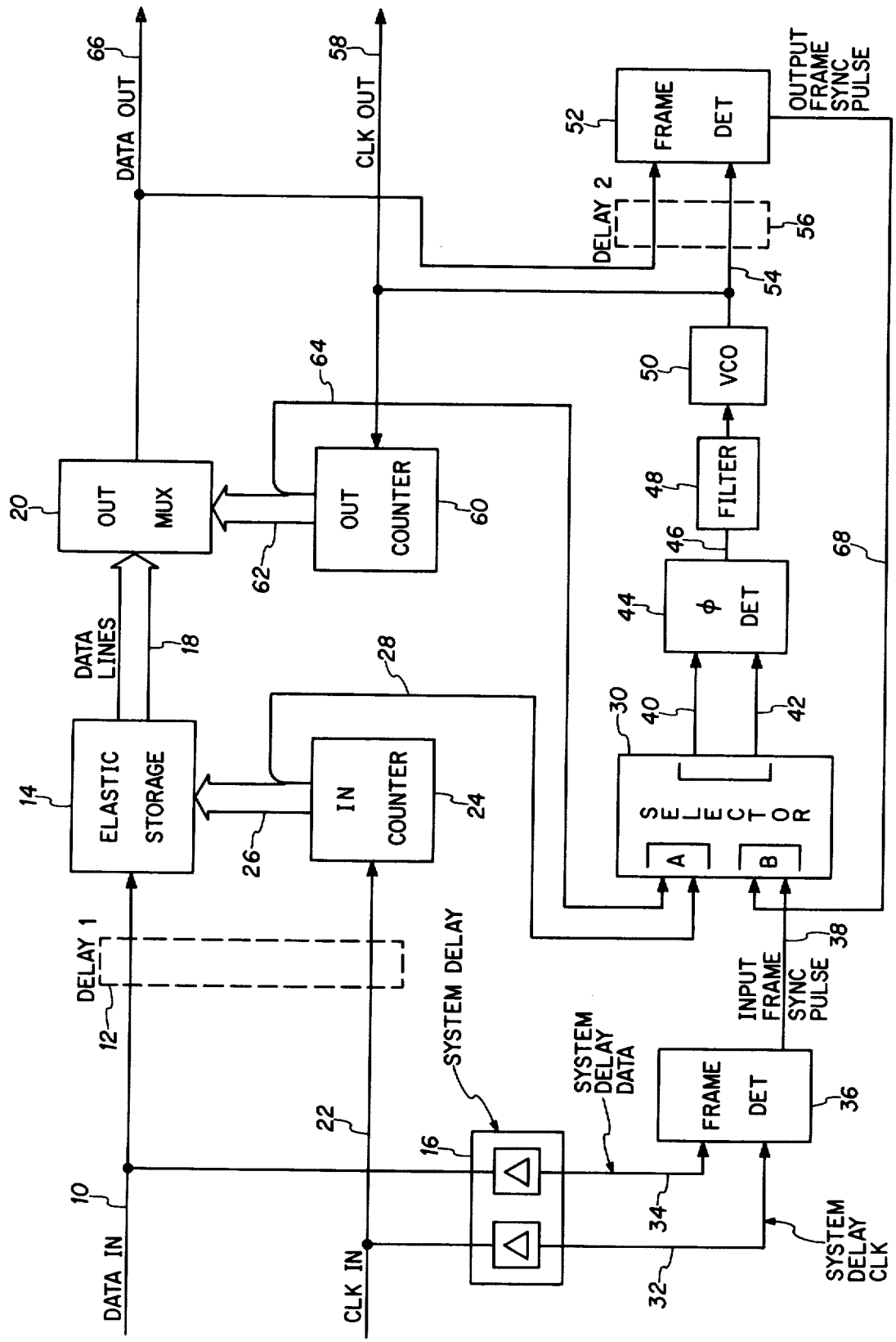

DIGITAL DELAY LINE APPARATUS

THE INVENTION

The present invention pertains generally to electronics and more specifically to delay lines. Even more specifically, the invention pertains to an approach for delaying digital data bits in a completely continuous variable manner rather than the discrete incremental amount used in the prior art.

While there are various types of analog delay lines in the prior art, these delay lines tend to provide distortion and intermodulation between adjacent signals when the signals being delayed are digital data bits or pulses. As is well-known to those skilled in the art, the amount of distortion increases as a function of the frequency of data bits being transmitted and thus the difficulty of accurately detecting the digital data value also increases. Sometimes this increase was exponential rather than directly.

All known prior art for digitally delaying digital signals has involved a delay which is a precisely defined incremental amount of the duration of the digital signal and this amount is related to a clocking or reference frequency. Thus, if very small delay increments were required, a very high frequency reference needed to be used.

The present invention takes incoming data and stores it in an addressable storage medium. This storage medium is designed such that as new data is received, the oldest stored data is eliminated. Further, as designed, the storage medium can output any given bit of stored data at any designated time. In other words, the clocking signal for inputting data bears no direct relation to the clocking signal for outputting data. The clock signal for outputting data is produced by a phase lock loop which compares the time of occurrence of output data pulses or the output data stream with a reference signal and a phase lock loop is used to maintain these two compared signals in a prescribed relationship by adjusting the internal frequency which, in turn, adjusts the address signals used to output data from the elastic buffer. In this manner, the data stored in the elastic storage means can be delayed any given amount by delaying the phase lock loop input and is not tied to some incremental portion of the storage clock signal.

It is therefore, an object of the present invention to provide an improved delay line.

Other objects and advantages of the present invention may be ascertained from a reading of the specification and appended claims in conjunction with the single FIGURE which shows a block diagram of the present concept.

DETAILED DESCRIPTION

A Data In line 10 supplies a digital data stream through a dash line block 12 entitled Delay 1 to an elastic storage block 14. It also supplies signals to a system delay block 16 which represents some type of other system having a delay. A parallel output from elastic storage means 14 is provided on a set of leads 18 to an output multiplexer 20. A clock input signal is provided on lead 22 and is also supplied to system delay block 16 as well as being supplied through the delay 1 block 12 to an input counter 24. Counter 24 provides a set of leads 26 to address the storage means 14 and a decode signal which, in the preferred embodiment is the most significant bit (MSB) of the signals provided on the set of leads 26, is provided on a lead 28 to an A input of a selector block 30. (As will be realized by those skilled in the art, a signal other than the MSB can be used as the decode signal). After being delayed by system delay 16, the clock and data signals are supplied on leads 32 and 34, respectively, to a frame detection block 36 which provides a sync pulse output on a lead 38 to one of the B inputs of selector 30. Selector 30 provides two output signals on leads 40 and 42 to a phase detector 44. The signals on leads 40 and 42 are one pair of the A input leads or the B input leads. Phase detector 44 provides an output signal on a lead 46 representative of the difference in phase of the signals on the two inputs. The signal on lead 46 is applied through a low-pass filter 48 to a VCO (voltage controlled oscillator) or variable frequency oscillator 50. VCO 50 provides a high frequency clock signal to a frame detector 52 on a lead 54. The lead 54 also supplies signals to a dash line block 56, labeled Delay 2, and from there to a clock output line labeled 58. Lead 58 is also applied as an input to an output counter 60 which has a plurality of output leads 62 applied to output multiplexer 20. The most significant bit lead of the plurality of leads 62 is relabeled 64 and applied as a second input to the A inputs of selector 30. An output of output multiplexer 20 is supplied on a lead 66 to an apparatus output as well as to a second input of frame detector 52. Frame detector 52 provides an output on lead 68 indicative of the output frame pulses to a second B input of selector 30.

OPERATION

The blocks 30, 44, 48, 50, 52 and 60 constitute a phase lock loop which is the subject matter of a copending application of mine, Ser. No. 909,737, filed May 22, 1978 and assigned to the same assignee as the present invention. Reference should be made to this application for a more complete description. However, it operates on the general principles of a phase lock loop in that the detector 44 provides an output which is indicative of the difference in phase of the two inputs supplied on 40 and 42. This output signal is then filtered to provide a relatively stable DC signal which is applied to the VCO 50. The frequency of VCO 50 is counted by counter 60 whose output is a count which rolls over whenever a maximum is reached. The most significant bit of this output of counter 60 is returned on lead 64 to selector 30 where it passes through selector 30 to lead 40 when the selector is in the A mode. The other input to the A mode of selector 30 is obtained from counter 24. Whenever the two inputs on leads 28 and 64 are other than a given 180 degrees different in phase, an output is provided from phase detector 44 which alters the frequency of VCO 50 and changes the relative time of occurrence of the most significant bit for the two counters 24 and 60.

If it now be assumed that data signals are input on lead 10 and clock signals are input on 22, it may be determined that the incoming data is stored in successive positions in elastic storage 14 in accordance with the consecutive count addresses supplied by counter 24 through leads 26. As will be realized from an examination of this disclosure, although there is data bit synchronization between the input and output counters 24 and 60, there is no need for frame synchronization when the apparatus is operating in the selector 30 A input mode. The parallel lines 18 are representative of all the storage of elastic storage 14 which in one embodiment was eight bits. These lines are supplied to a multiplexing device 20 and one of these lines is selected by the address appearing on the set of leads 62. In one embodiment of the present inventive concept, the system delay block 16 and frame detector 36, along with frame detector 52, did not enter into continuous use. Thus, normally, the data was input on lead 10 and would be delayed in elastic storage 14 for one-half the maximum total possible delay (i.e., the time required necessary to receive four data bits) and then it would be output on lead 66 in response to an adress on leads 62. The one-half normal delay may be optionally changed by altering the counter 24 and 60 decodes obtained on lines 28 and 64.

In one use of the present invention and as illustrated, it was desired that an alternate transmission path be phase aligned with an original data transmission path before switchover occurred. Since a given system may have various types of delays which are not only different from supposedly identical transmission paths but in addition may vary with time, it is desirable to have a system which can become aligned in phase prior to and at the time of switching. Thus, the system delay block 16 is used to represent an original data transmission path which must be matched by a system including Delay 1. In other words, dash line block 12 and the elastic buffer represented by storage means 14 and multiplex 20 constitute an additional "system delay".

Since the delay in the system 16 could be more or less than the delay in the alternate transmission path block 12, it is desirable that the storage capability of block 14 be greater than the delay in system 16, both as to added or positive delay and as to subtracted or negative delay.

In operation, the system 16 would have as its outputs the data and clock leads 32 and 34 which would be used to transmit data to other end users. When it has been decided that an alternate transmission path will be used, this data as input on lead 10 is also applied to delay 1 block 12 and accordingly to the elastic buffer. The clock signal on lead 22 is also applied to block 12 and accordingly to the in counter block 24. The selector is placed in the B mode so that phase detector 44 starts detecting the difference in time of occurrence of the frame sync pulse from the input data as delayed by block 16 and the alternate path for input data as output by multiplex 20. It is assumed that the normal prior operation has left the elastic buffer in a condition where there is a delay of half of the maximum possible storage capabilities of elastic storage 14. Accordingly, the counter 60 will count either faster or slower depending upon the action of VCO 50 in response to the new phase detection inputs as output by block 44 to adjust the occurrence of the data being output on lead 66 to a known phase with respect to the data output on leads 32 and 34 by the original transmission system. When a given phase relationship is obtained, the alternate system is ready to take over data transmission with no phase "glitches" to desynchronize frame detectors and other detection circuitry downstream. That is, leads 32 and 34 are substituted for 58 and 66 as the source of output signals. Since a phase detector such as 44 normally provides minimum output when the input signals are 180 degrees out of phase, a compensation needs to be used at some point in the system to prevent this "misalignment" from appearing when the apparatus is switched from the original transmission system to the alternate. This can be accomplished by the delay block 56, labeled Delay 2. This would not affect the output signals from block 36 as used by downstream equipment but would only affect the operation of the system as shown in the drawing.

While the preferred embodiment of the invention is utilized to phase align an alternate transmission path with an original transmission path, it can also be used independently as a means of phase delaying a data stream such as appearing on line 10 and as output on line 66. This may be accomplished by using any independent means of generating a sync pulse to be input on lead 38 or it can be used with respect to the original incoming data by merely having some type of analog delay line for block 16. In either case, the digital data being input to elastic storage 14 is output from multiplexer 20 at a time dictated by the clock signals appearing on lead 54 and, since this clock source is analog controlled as a function of the incoming clock appearing on lead 22, there can be continuous and infinitesimal adjustments in phase delay between input and output data bits.

In view of the possible variations which will be readily apparent to those skilled in the art, I wish to be limited only by the scope of the appended claims.

I claim:

1. Apparatus for providing continuous delay adjustment of a digital delay line comprising, in combination:
   first means for supplying data bit stream signals;
   second means for supplying clock bit stream signals;
   elastic store means, connected to said first and said second means for receiving signals therefrom, said elastic store means operating to consecutively store received data bits at times dictated by clock bit signals and to parallel output stored data bits;
   multiplex means, including address input means, data input means and data output means, for outputting at least one addressed input bit upon command;
   means connecting said elastic store means to said data input means of said multiplex means for supplying data bits thereto;
   phase lock loop means, including first and second signal input means and command signal output means, for altering command signals in accordance with deviation of phasing of signals applied at said first and second signal input means from a desired value;
   means connecting said data output means of said multiplex means to said first signal input means of said phase lock loop means;
   means for supplying signals of variable phase, with respect to the phase of data signals supplied by said first means, to said second signal input means of said phase lock loop means; and
   means connecting said command signal output means of said phase lock loop means to said address input means of said multiplex means for supplying signals thereto.

2. The method of delaying a digital data bit stream comprising the steps of:
   storing incoming data bit in a storage means while eliminating the oldest previously stored data bit;
   periodically outputting stored data bits in accordance with address command control signals;
   supplying reference phase signals;
   comparing the phase of output data bits with the phase of the reference phase signals; and
   generating address command control signals in accordance with the results of the comparison.

3. Apparatus for delaying a digital data bit stream comprising, in combination:

means for storing incoming data bits in a storage means while eliminating the oldest previously stored data bit;

means for periodically outputting stored data bits from said means for storing incoming data bits in accordance with address command control signals;

means for supplying reference phase signals;

means for comparing the phase of output data bits from said means for periodically outputting stored data bits with the phase of the reference phase signals from said last named means; and means for generating address command control signals in accordance with the results of the comparison and applying same to said second named means.

4. The method of matching the system delay of a system #1 with the system delay of a system #2 wherein system #1 comprises at least an elastic buffer with an addressable storage for outputting stored data bits upon command comprising the steps of:

applying a data bit stream to both of systems #1 and #2;

detecting the time of occurrence of a periodically occurring signal condition at the output of system #1 and providing a first signal indicative thereof;

detecting the time of occurrence of a periodically occurring signal condition at the output of system #2 and providing a second signal indicative thereof;

comparing the time of occurrence of said first and said second signals with a phase lock loop; and addressing the addressable storage in the elastic buffer in accordance with the relative time of occurrence of said first and said second signals to maintain equal system delays.

5. Apparatus for matching the system delay of a system #1 with the system delay of a system #2 wherein system #1 comprises at least an elastic buffer with an addressable storage for outputting stored data bits upon command comprising, in combination:

first system means comprising at least an elastic buffer including data input means, data output means and address input means for temporarily storing input data and outputting the data as addressed at a subsequent time as determined by address input signals;

second system means for passing data bits of a data bit stream therethrough and having a time delay in passage which may vary;

means for supplying a stream of data bits to said data input means of both said first and said second system means;

first detection means connected to said data output means of said first system means for detecting the time of occurrence of a periodically occurring signal condition and providing a first signal indicative thereof;

second detection means connected to said data output means of said second system means for detecting the time of occurrence of a periodically occurring signal condition and providing a second signal indicative thereof;

comparison means, comprising at least a phase lock loop means, connected to said first and said second detection means for receiving said first and said second signals therefrom and for comparing the time of occurrence of said first and said second signals; and address means connected between said comparison means and said address input means of said first system means for providing output address signals to the addressable storage in the elastic buffer of said first system means in accordance with the frequency of operation of a VCO in the phase lock loop.

* * * * *